United States Patent [19]

Aoki et al.

[11] Patent Number: 5,194,744
[45] Date of Patent: Mar. 16, 1993

[54] COMPACT RETICLE/WAFER ALIGNMENT SYSTEM

[75] Inventors: Shinichiro Aoki; Takeo Sato, both of Kawasaki; Masaki Yamamoto, Tokyo; Hiroyuki Takeuchi, Kawasaki; Nobuhiro Araki, Yokohama; Yoshiyuki Sugiyama, Ayase, all of Japan

[73] Assignee: Matsushita Electric Industrial Co., Ltd., Osaka, Japan

[21] Appl. No.: 704,406

[22] Filed: May 23, 1991

[30] Foreign Application Priority Data

May 25, 1990 [JP] Japan .................................. 2-135919

[51] Int. Cl.$^5$ ......................................... G01N 21/86
[52] U.S. Cl. .................................... 250/548; 356/401
[58] Field of Search ....................... 250/548, 557, 225; 356/400, 401

[56] References Cited

U.S. PATENT DOCUMENTS

| 4,262,208 | 4/1981 | Suzuki et al. | |
|---|---|---|---|
| 4,631,416 | 12/1986 | Trutna, Jr. | |
| 4,664,524 | 5/1987 | Hattori et al. | 250/548 |
| 4,697,087 | 9/1987 | Wu | 250/548 |
| 4,962,318 | 10/1990 | Nishi | 356/401 |

FOREIGN PATENT DOCUMENTS

| 0182251 | 5/1986 | European Pat. Off. |
|---|---|---|
| 0220571 | 5/1987 | European Pat. Off. |
| 60-144937 | 7/1985 | Japan |

OTHER PUBLICATIONS

"Alignment System in a Stepper Apparatus" by Uchida et al; Semicon News 1989. 5; pp. 98–104.
"Holographic Nanometer Alignment for a Wafer Stepper" by N. Nomura et al; SDM87-149; pp. 31–36 (no publication date).
"Direct-Referencing Automatic Two-Points Reticle-to-Wafer Alignment Using a Projection Column Servo System" by Brink et al; SPIE vol. 633 Optical Microlithography V(1986); pp. 60–71.

Primary Examiner—David C. Nelms
Attorney, Agent, or Firm—Pollock, Vande Sande & Priddy

[57] ABSTRACT

A reticle/wafer alignment system provided with a laser beam source for emitting laser beams, a first optical system portion for a reticle/wafer alignment which consists of a first optical sub-system for receiving laser beams from the laser beam source and projecting the received laser beams onto alignment marks formed on a substrate and made up of diffraction gratings and a second optical sub-system for gathering laser beams diffracted by the alignment marks to form an image thereof, a photoelectric detection portion for performing a photoelectric conversion of the gathered laser beams, a position detecting portion for measuring the position of the substrate based on a signal outputted from the photoelectric detection portion, a second optical system portion for an image processing which consists of a third optical sub-system for illuminating the alignment marks and a fourth optical sub-system having a television camera for observing the image of the alignment marks, and an image processing portion for performing an image processing of video signals outputted from the television camera. The first and second optical system portions are made in such a manner to have a common part thereof. Thereby, an entire alignment system can be made to be compact. Consequently, a position measurement accuracy can be improved.

8 Claims, 6 Drawing Sheets

COMPACT RETICLE/WAFER ALIGNMENT SYSTEM

BACKGROUND OF THE INVENTION

1. Field of The Invention

This invention generally relates to an alignment system for effecting an alignment of a substrate and more particularly to an alignment system for performing a reticle/wafer alignment in order to expose a pattern of the reticle on the wafer.

2. Description of The Related Art

With progress in microminiaturization of a pattern of a semiconductor, an alignment system for effecting a reticle/wafer alignment becomes more and more important in recent years. As an example of a conventional alignment system, a system disclosed in Japanese Patent Application Provisional Publication No. 60-144937 Official Gazette is publicly known. Hereinafter, such a conventional alignment system will be described by referring to FIG. 6.

FIG. 6 is a perspective view of a conventional alignment system. In this figure, reference numeral 101 designates a reticle; 102 a wafer; 103 a light source for an exposure; 104 a projection lens to be used for a shrinkage (i.e., reduction in size) and replication of an exposing pattern of a reticle on a wafer; 105 an exposing pattern of a reticle; 106 an optical fiber (i.e., a light guide) for transmitting illumination light; 107 a condenser lens for gathering illumination light; 108 and 110 reflecting mirrors for reflecting illumination light; 109 a beam splitter for reflecting illumination light; 111 an objective lens for projecting illumination light onto an alignment mark on the wafer 102; 112 alignment marks; 113 a lens for forming an image through the objective lens 111, the mirror 110 and the beam splitter 109 in a video camera; 114 a relay lens; 115 a video camera for observing the image obtained by using the objective lens 111 through the image forming lens 113 and the relay lens 114 and for outputting video signals of which a image processing is performed by an image processing portion (not shown); 116 a laser beam source for emitting a laser beam to be used for an alignment of a wafer; 117 a laser beam; 118 and 119 mirrors for reflecting the laser beam 117; 120 an objective lens for projecting the laser beam 117 onto alignment marks consist of diffraction gratings of the wafer 102; 121 the alignment marks; 122 a spatial filter for filtering only diffracted light among the diffracted light, which is caused by the projection, and light directly reflected by the alignment marks; 123 the light diffracted light by the alignment marks; 124 the light directly reflected by the alignment marks 121; and 125 a photodetector for detecting the filtered light 123.

Hereinafter, an operation of the conventional system constructed as described above in case of performing an alignment of a wafer will be described by way of example.

First, the wafer 102 is transferred by the wafer transfer system (not shown) to an alignment position. Then, the demagnification and replication of the exposing pattern 105 of the reticle 101 illuminated with light from the light source 103 onto the wafer 102 is effected. At that time, for the alignment of the wafer 102, illumination light is first projected onto the alignment marks on the wafer 102 through the optical fiber 106, the condenser lens 107, the mirrors 108 and 110, the beam splitter 109 and the objective lens 111. Subsequently, an image of the alignment marks 112 is observed through the objective lens 111, the mirror 110, the beam splitter 109, the image forming lens 113 and the relay lens 114 by using the video camera 115. Further, the positions of the alignment marks 112 are measured by effecting the image processing by working the image processing portion. Based on the results of the measurement of the positions of the alignment marks, a stage on which the wafer is mounted (hereunder referred to as a wafer stage) is moved by using a stage moving system (not shown). Thus, a coarse alignment of the wafer 102 is effected. Next, the laser beam 117 is emitted from the source 116. This laser beam is projected onto the alignment marks 121 on the wafer 102 through the mirrors 118 and 119 and the objective lens 120. Then, the diffracted light 123 is separated from the directly reflected light 124 by the spatial filter 122 through the objective lens 120 and the mirror 119. Thereby, only the diffracted light 123 is detected by the photodetector 125. At that time, the alignment marks 121 are scanned by changing the relative positions of a laser spot and each alignment mark by utilizing the movement of the wafer 102 or vibrations of the mirror 118. The intensity of the reflected light reaches a maximum when the laser beam is projected on the center of the alignment mark 121. This position (i.e., the center) of the alignment mark 121 is determined as the alignment position of the wafer 102. In this way, the alignment of the wafer 102 is performed by moving the wafer 102 by the wafer transfer system such that a result of the detection is obtained.

The above described conventional system, however, has a drawback that the alignment accuracy deteriorates because the intensity of the reflected light changes depending on the conditions of the surface of the wafer 102 and that thus submicron lighography cannot be realized. Moreover, the conventional system has another drawback that a few pairs of an image processing sub-system, which are made up of a microscope including an objective lens 111, and a laser alignment sub-system using the laser beam 117 need to be provided to each of the reticle 101 and the wafer 102, and thus a correlation between the two kinds of systems (namely, the image processing system and the laser alignment system) cannot be found from thermal and vibrational changes and a variation with time occurred therebetween, and consequently an alignment accuracy is degraded and the size of the alignment system inevitably becomes large. Moreover, the conventional system has still another drawback that it is necessary for the purpose of determining the alignment position to detect a relative position, at which the output of the system reaches a maximum, by reciprocatively driving the wafer stage and repeatedly emitting laser beams and in addition such a detecting operation is very cumbersome.

The present invention is created to eliminate the above described drawbacks of the conventional system.

It is accordingly an object of the present invention to provide an alignment system which can realize a high accuracy alignment and also achieve miniaturization thereof.

Further, it is another object of the present invention to provide an alignment system which can attain high accuracy position measurement without reciprocatively driving the wafer stage and repeatedly emitting laser beams.

SUMMARY OF THE INVENTION

To achieve the foregoing object and in accordance with a first aspect of the present invention, there is provided an alignment system which comprises a laser beam source for emitting laser beams, a first optical system portion for a reticle/wafer alignment which consists of a first optical sub-system for receiving laser beams from the laser beam source and projecting the received laser beams onto alignment marks, made up of diffraction gratings, formed on a substrate. There is also provided a second optical sub-system for gathering laser beams diffracted by the alignment marks to form an image thereof, a photoelectric detection portion for performing a photoelectric conversion of the gathered laser beams, a position detecting portion for measuring the position of the substrate based on a signal outputted from the photoelectric detection portion, a second optical system portion for an image processing which consists of a third optical sub-system for illuminating the alignment marks and a fourth optical sub-system having a television camera for observing the image of the alignment marks. An image processing portion is provided for performing an image processing of video signals outputted from the television camera. In this alignment system, the first and second optical system portions are made in such a manner to have a common part thereof.

Further, in accordance with a preferred embodiment of the present invention, there is provided an alignment system wherein the laser beam source emits laser beams having two wavelengths, two corresponding frequencies slightly different from each other and planes of polarization intersecting perpendicularly to each other. The first optical sub-system comprises unpolarized beam splitting means for splitting the two-luminous-flux laser beams, in which two kinds of laser beams respectively having different wavelengths, emitted from the laser beam source into unpolarized laser beams and a half-wave plate for changing the direction of vibration of one of the two kinds of laser beams obtained by the split. The second optical sub-system comprises a condenser lens and a polarizer for selecting one of the two planes of polarization.

Moreover, in accordance with another preferred embodiment of the present invention, there is provided an alignment system wherein the laser beam source emits laser beams having two wavelengths, two corresponding frequencies slightly different from each other and planes of polarization intersecting perpendicularly to each other, wherein the first optical sub-system comprises a polarization beam splitter for splitting the laser beams and a quarter-wave plate for converting the laser beams obtained by the split from linearly polarized light to circularly polarized light.

Furthermore, in accordance with yet another preferred embodiment of the present invention, there is provided an alignment system wherein the laser beam source emits laser beams having two wavelengths, two corresponding frequencies slightly different from each other and planes of polarization intersecting perpendicularly to each other, wherein the second optical sub-system comprises a condenser lens and a polarizer for converting the laser beams from linearly polarized light to circularly polarized light.

Additionally, in accordance with still another preferred embodiment of the present invention, there is provided an alignment system wherein the position detecting portion employs a phase meter for detecting a difference in phase between a reference signal outputted from the laser beam source and a measuring signal outputted from the photoelectric detection portion.

In addition, in accordance with a still further preferred embodiment of the present invention, there is provided an alignment system wherein the substrate comprises a reticle and a wafer on which a pattern on the reticle is projected by being shrunken, wherein alignment marks made up of diffraction gratings are formed on the reticle and the wafer, wherein alignments of the reticle and the wafer are performed by effecting an image processing of a plurality of the alignment marks and position detections thereof using laser beams.

Furthermore, in accordance with a further preferred embodiment of the present invention, there is provided an alignment system wherein each of the first and second optical sub-systems includes an optical system having an optical conjugate relation with the alignment mark on the substrate.

Thus, an entire alignment system can be made to be compact by employing an optical sub-system part common to the second optical system portion for a coarse position measurement and the first optical system portion for a fine position measurement. Moreover, the intensity of the diffracted light which is reflected by the alignment marks can be averaged by employing equi-pitch diffraction gratings as the alignment marks as described above. Further, an influence of relative change caused with the lapse of time can be prevented by employing the common optical sub-system part as described above.

Furthermore, the position deviation quantity can be detected as a phase of a beat signal having two frequencies by using laser beams which have two frequencies slightly different from each other and polarized surfaces intersecting perpendicularly from each other.

Namely, miniaturization of the alignment system can be achieved by employing an optical sub-system part common to the first and second optical system portions. Consequently, a higher accuracy position measurement can be achieved without any reciprocation of the wafer stage.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which.

DETAILED DESCRIPTION OF THE PREFERRED EMBODIMENT

Hereinafter, preferred embodiments of the present invention will be described in detail by referring to the accompanying drawings.

To begin with, a first embodiment of the present invention will be described hereinbelow.

Figure 1:
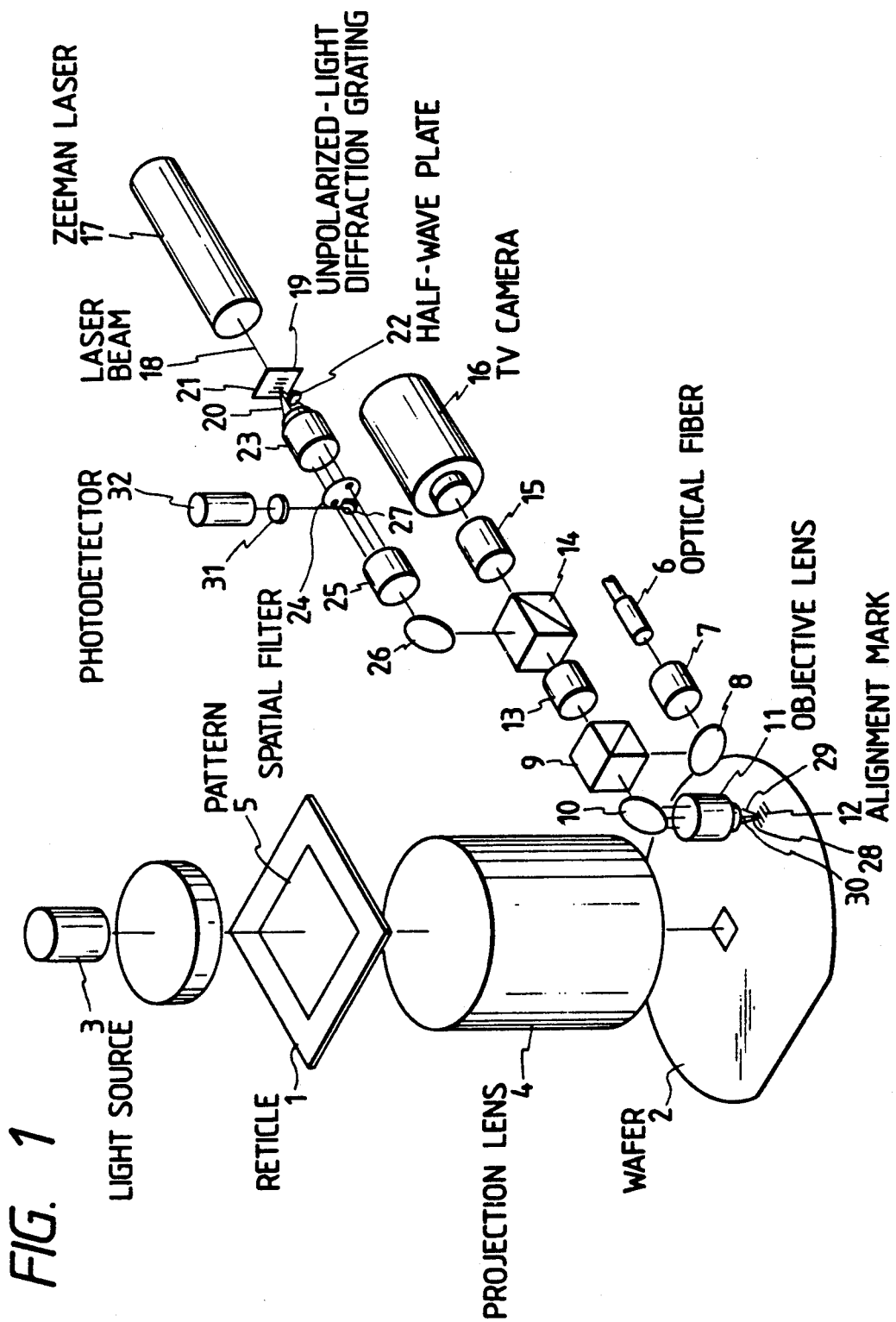
FIG. 1 is a perspective diagram for illustrating the entire construction of a first alignment system embodying the present invention.
Figure 2:
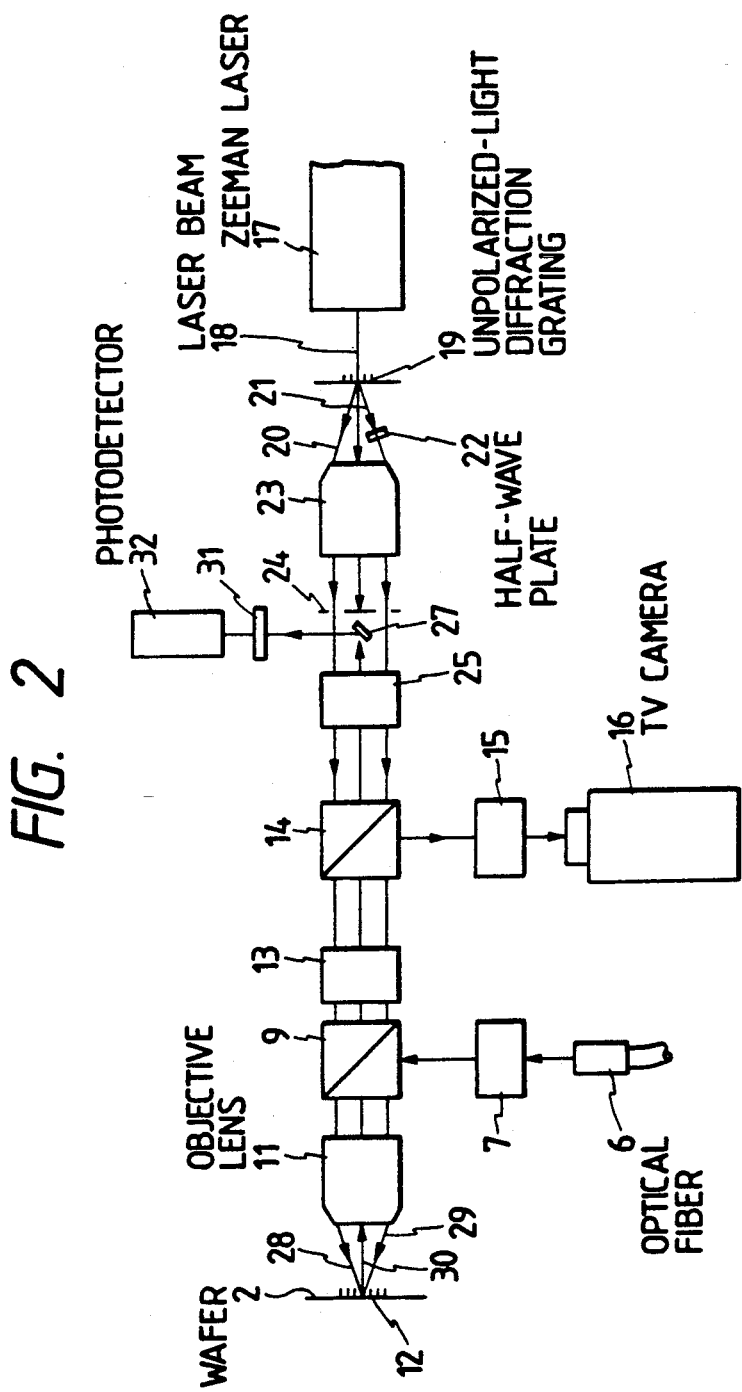
FIG. 2 is a schematic block diagram for illustrating the construction of an optical sub-system of the alignment system of FIG. 1.

FIGS. 1 and 2 show the first embodiment of the present invention. FIG. 1 illustrates the entire configuration of the first embodiment. FIG. 2 shows an optical sub-system provided in the first embodiment.

FIGS. 1 and 2, reference numeral 1 designates a reticle; 2 a wafer; 3 a light source for an exposure; 4 a projection lens for shrinking and replicating a pattern for an exposure pattern of the reticle 1 on the wafer 2; 5 the pattern for an exposure of the reticle 1; 6 an optical fiber for transmitting illumination light; 7 a condenser lens for gathering illumination light; 8 and 10 reflecting mirrors for reflecting illumination light; 9 a beam splitter for reflecting illumination light; 11 an objective lens for projecting illumination light onto alignment marks which are made up of equi-pitch diffraction gratings on the wafer 2; 12 alignment marks (i.e., diffraction gratings); 13 a lens for forming an image through the objective lens 11, the mirror 10 and the beam splitter 9 in a video camera; 14 a beam splitter; 15 a relay lens; 16 a video camera for observing the image obtained by using the objective lens 11 through the image forming lens 13 and the relay lens 15 and for outputting video signals of which an image processing is performed by an image processing portion (not shown). Further, reference numeral 17 denotes a Zeeman laser for an alignment emitting laser beams having wavelengths $l_1$ and $l_2$, whose frequencies are slightly different from each other and whose planes of polarization intersect perpendicularly to each other; 18 the laser beam emitted from the Zeeman laser; 19 equi-pitch unpolarized-light diffraction gratings which are formed at a regular pitch on the wafer; and 20 and 21 ±first order unpolarized and diffracted beams. When the laser beam 18 impinges on the gratings 19, each of the gratings 19 transmits the laser beam and also diffracts the laser beam so as to produce the positive and negative first order unpolarized and diffracted beams 20 and 21 each of which includes two beam components having wavelengths different from each other. Moreover, reference numeral 22 represents a half-wave plate for altering the direction of vibration of the negative (−) first order diffracted beam 21; 23 an incident image forming lens on which the positive and negative first order unpolarized and diffracted beams 20 and 21 are incident; 24 a spatial filter for transmitting only the positive and negative first order unpolarized and diffracted beams 20 and 21 among diffracted beams which impinge on neighborhood of an entrance pupil of the incident image forming lens 23; 25 another incident image forming lens for projecting transmitted parts of the first order diffracted beams 20 and 21 on the wafer 2; 26 a mirror for guiding the diffracted beams 20 and 21 to the beam splitter 14; 27 a mirror interposed between the image forming lens 25 and the spatial filter 24 for reflecting a diffracted beam which is reflected in the direction of an optical axis of the objective lens 11 through the mirror 10, the beam splitter 9, the image forming lens 13, the beam splitter 14, the mirror 26 and the incident image forming lens 25 among beams reflected by the diffraction gratings 12 of the wafer 2 on which ± first order diffracted beams are projected; 28 and 29 the projected positive and negative first order diffracted beams; 30 the diffracted beam reflected in the direction of an optical axis of the objective lens 11; 31 a polarizer for polarizing the diffracted beam 30; and 32 a photodetector, which is comprised of a photodiode, photomultiplier and so on, for detecting a deviation in position between the beam 30 transmitted through the polarizer and the alignment mark 12. Incidentally, an optical sub-system comprising the lenses 23 and 25 and another optical sub-system have a conjugate relation with each other.

Hereinafter, the construction of the first embodiment, as well as an operation of the first embodiment, which is constructed as above described, in case of performing an alignment of the wafer, will be further detailedly described.

First, the wafer 2 is transferred by the wafer transfer system (not shown) to an alignment position. Then, the demagnification (namely, the shrinkage) and replication of the exposing pattern 5 of the reticle 1 illuminated with light from the light source 3 onto the wafer 2 is effected. At that time, for the alignment of the wafer 2, illumination light is first projected onto the alignment marks on the wafer 2 through the optical fiber 6, the condenser lens 7, the mirrors 8 and 10, the beam splitter 9 and the objective lens 11. Subsequently, an image of the alignment marks 12 is observed through the objective lens 11, the mirror 10, the beam splitter 9, the image forming lens 13, the beam splitter 14 and the relay lens 15 by using the video camera 16. Further, the positions of the alignment marks 12 are measured by effecting the image processing by working the image processing portion. Based on the results of the measurement of the positions of the alignment marks, a wafer stage on which the wafer is mounted is moved by using a stage moving system (not shown). Thus, a rough alignment of the wafer 2 is effected. Next, the laser beams 18 having the two wavelengths $l_1$ and $l_2$ and planes of diffraction intersecting perpendicularly with each other are incident on the diffraction gratings 19 and are diffracted thereat. The direction of polarization of the negative one 21 of the beams 20 and 21 diffracted by the diffraction gratings 19 is changed by the half-wave plate 22. These diffracted beams 20 and 21 are incident on the objective lens 23. Only the first order diffracted beams 20 and 21 among the beams incident on neighborhood of the entrance pupil of the objective lens 23 are transmitted through the spatial filter 24. An angle $\theta$ of diffraction of the diffraction beams 20 and 21 is given by:

$$\theta = \arcsin (\lambda/P) \tag{1}$$

where $\lambda$ designates a wavelength of one of the beams 18; and P the pitch of the diffraction gratings 19.

These first order diffracted beams 20 and 21 are projected on the alignment position 12 of the wafer 2 through the incident image forming lens 25, the mirror 26, the beam splitter 14, the image forming lens 13, the beam splitter 9, the mirror 10 and the objective lens 11. If the pitch of the alignment marks 12 is equal to that P of the diffraction gratings 19 and an optical sub-system comprised of elements from the incident objective lens 23 to the image surface of the incident image forming lens 25 is made to be equivalent to another optical sub-system comprised of elements from the image surface to the objective lens 11 through the image forming lens 13, the laser beams 28 and 29 projected from the objective lens 11 onto the alignment marks 12 of the wafer 2 meet the equation (1). Thus, the diffracted beam 30, which is reflected in the direction of the optical axis of the objective lens 11, among the diffracted beams produced at the alignment marks 12 is reflected by the mirror 27 through the mirror 10, the beam splitter 9, the image forming lens 13, the beam splitter 14, the mirror 26 and the incident image forming lens 25 and is incident on the photodetector 32 through the polarizer 31. At that time, the quantity of a deviation in position (hereunder referred to as a position deviation quantity) between the diffraction gratings 12 and the alignment marks 12 can be detected as a difference in phase (hereunder referred to as a phase difference) by regulating the direction of rotation of the polarizer 31 and using a position detecting portion (not shown). Namely, because the position deviation quantity x, the pitch P and the phase difference $\phi$ satisfy the following equation (2), the position deviation quantity x can be found by measuring the phase difference $\phi$.

$$\phi = 360° \cdot 2x/P \quad (2)$$

Thus a high-precision position measurement is effected by this laser measurement. Namely, a high-accuracy alignment of the wafer 2 is performed.

Thus, this embodiment employs an optical sub-system common to the image processing sub-system for a coarse position measurement and the laser alignment sub-system for a fine position measurement. Thereby, a compact alignment system can be realized. Moreover, an influence of relative change caused with the lapse of time is prevented. Furthermore, as described above, the alignment marks 12 are made up of equi-pitch diffraction gratings. Thus, the intensity of the diffracted light which is reflected by the alignment marks is averaged. Thereby, a measurement accuracy can be improved. Furthermore, the position deviation quantity can be detected as a phase of a signal by using laser beams having two frequencies and polarized surfaces intersecting perpendicularly with each other. Thereby, a high-accuracy measurement of the position deviation quantity can be achieved without any reciprocation of the wafer stage.

Incidentally, the Zeeman laser is employed as the laser beam source 17 in this embodiment. An ordinary laser, however, may be employed in place of the Zeeman laser. In such a case, the half-wave plate 22 becomes unnecessary. Further, it follows that the position measurement is effected by detecting the intensity of light instead of the phase of a signal and thus a maximum intensity of light is detected by reciprocatively driving the wafer stage and repeatedly emitting laser beams similarly as in the case of the conventional system.

Figure 3:
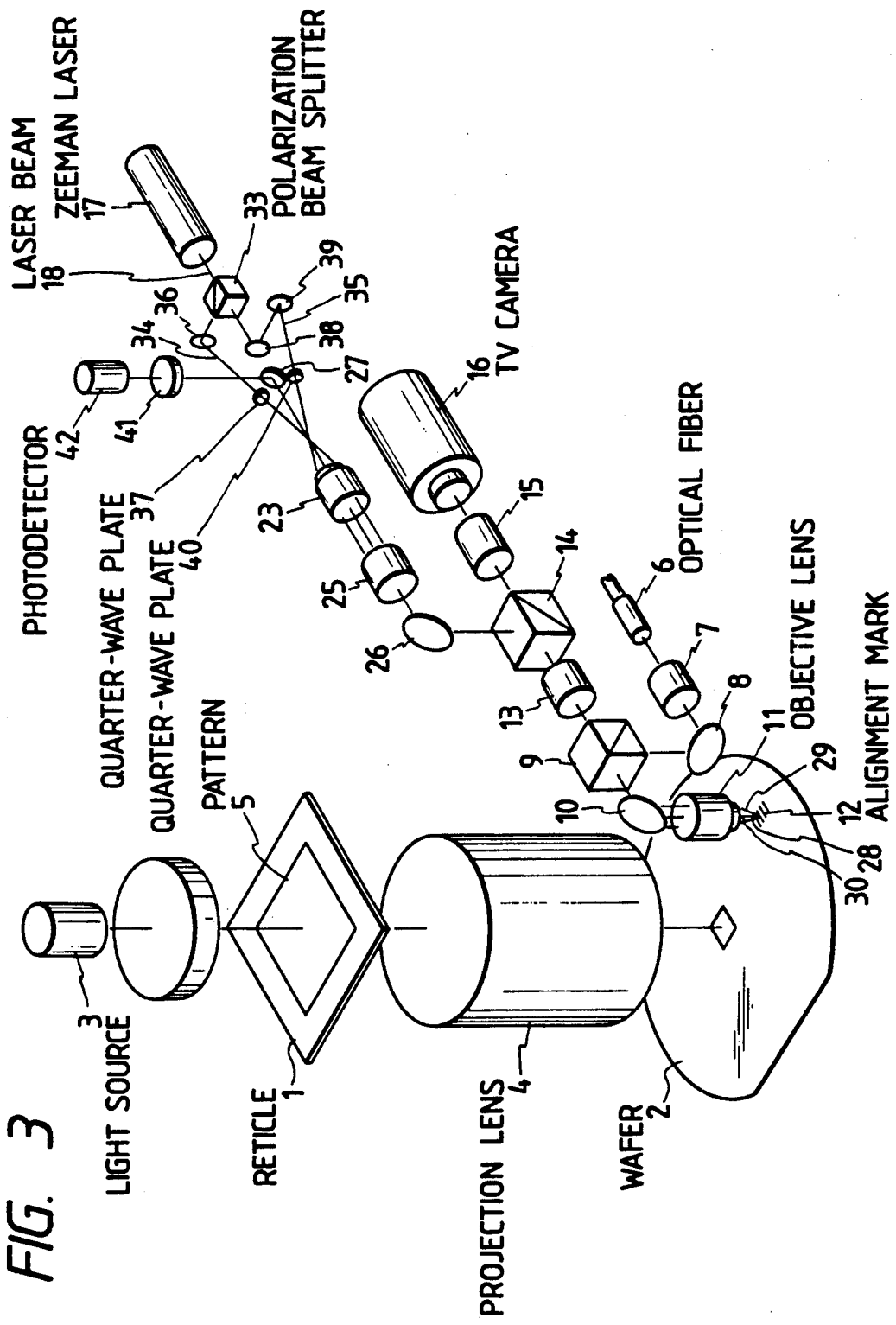
FIG. 3 is a perspective diagram for illustrating the entire construction of a second alignment system embodying the present invention.
Figure 4:
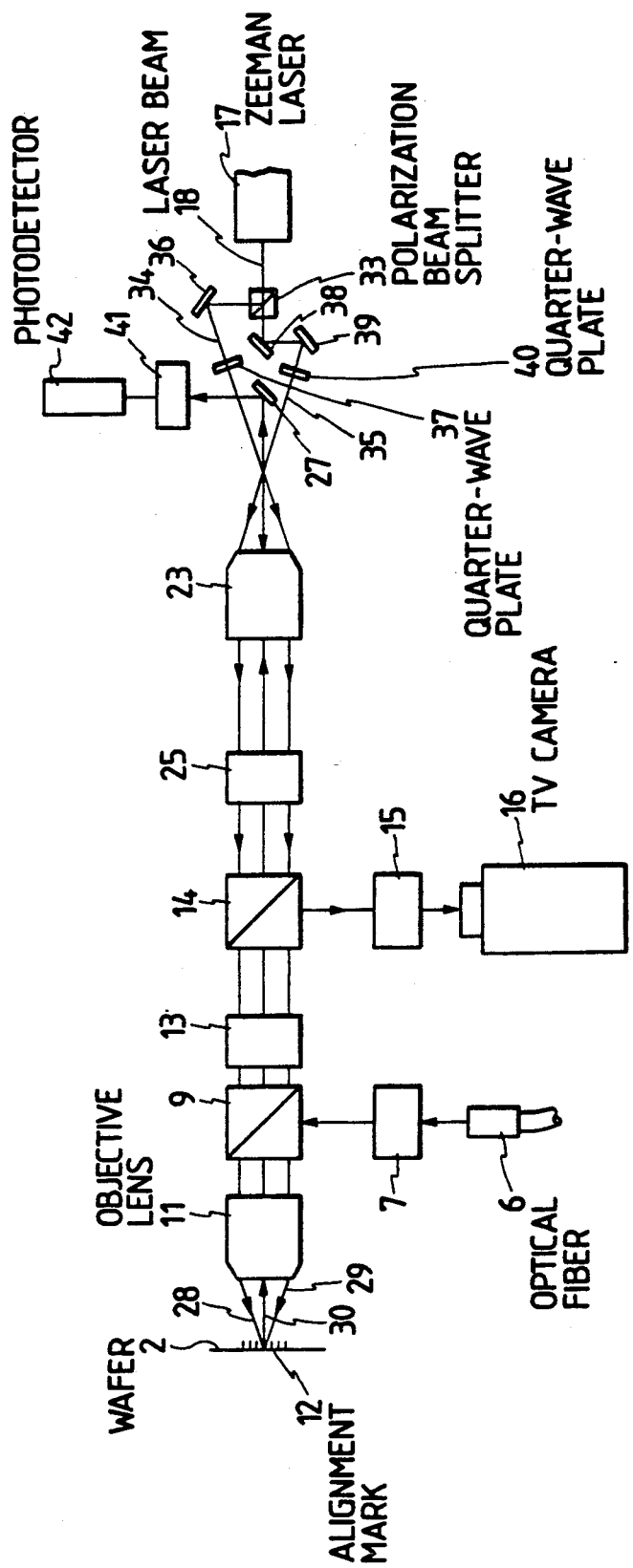
FIG. 4 is a schematic block diagram for illustrating the construction of an optical sub-system of the alignment system of FIG. 3.

Next, a second embodiment of the present invention will be described hereinbelow. FIGS. 3 and 4 illustrate a second alignment system embodying the present invention, namely, the second embodiment of the present invention. FIG. 3 shows the entire construction of the system of the second embodiment and FIG. 4 shows an optical sub-system thereof.

As illustrated in FIGS. 3 and 4, in this embodiment, laser beams 18 emitted from a Zeeman laser 17 is split by a polarization beam splitter 33 into a laser beam 34 having a vertical plane of polarization and a frequency of $f_1$ and another laser beam 35 having a horizontal plane of polarization and a frequency of $f_2$. On one hand, the laser beam 34 is reflected by a mirror 36 and then is converted from linearly polarized light to circularly polarized light by a quarter-wave plate 37. Thereafter, the converted laser beam 34 is incident on an incident objective lens 23. On the other hand, the laser beam 35 is reflected by mirrors 38 and 39 and then is converted from linearly polarized light to circularly polarized light by another quarter-wave plate 40. Subsequently, the converted laser beam 35 is also incident on the incident objective lens 23. The rest of the construction of this system is similar to that of the first embodiment except that a condenser lens 41 is employed in place of the polarizer 31.

Hereinafter, the construction of the second embodiment, as well as an operation of the second embodiment constructed as above described, will be more detailedly described.

First, a wafer 2 is transferred by a wafer transfer system (not shown) to an alignment position. Then, the demagnification and replication of an exposing pattern 5 of a reticle 1 illuminated with light from a light source 3 onto the wafer 2 is effected. At that time, for the alignment of the wafer 2, illumination light is first projected onto alignment marks on the wafer 2 through an optical fiber 6, a condenser lens 7, mirrors 8 and 10, a beam splitter 9 and an objective lens 11. Subsequently, an image of the alignment marks 12 is observed through the objective lens 11, the mirror 10, the beam splitter 9, an image forming lens 13, a beam splitter 14 and the relay lens 15 by using the video camera 16. Further, the positions of the alignment marks 12 are measured by effecting the image processing by working the image processing portion. Based on the results of the measurement of the positions of the alignment marks, a wafer stage (not shown) is moved by using a stage moving system (not shown) to effect a coarse alignment of the wafer 2. Next, the laser beams having two wavelengths $l_1$ and $l_2$, two corresponding frequencies $f_1$ and $f_2$ slightly different from each other and planes of polarization intersecting perpendicularly with each other are emitted from the Zeeman laser 17 and are incident on the polarization beam splitter 33. In the polarization beam splitter 33, the laser beams 18 emitted from a Zeeman laser 17 is split into the laser beam 34 having the vertical plane of polarization and the frequency of $f_1$ and the laser beam 35 having the horizontal plane of polarization and the frequency of $f_2$. On one hand, the laser beam 34 is reflected by the mirror 36 and then is converted from linearly polarized light to circularly polarized light by the quarter-wave plate 37. Then, the converted laser beam 34 is incident on the incident objective lens 23. On the other hand, the laser beam 35 is reflected by mirrors 38 and 39 and then is converted from linearly polarized light to circularly polarized light by the quarter-wave plate 40. Then, the converted laser beam 35 is also incident on the incident objective lens 23. It is assumed that angles of incidence of the incident laser beams 34 and 35 are denoted by $\theta$ and the wavelengths of the incident laser beams 34 and 35 are represented by $\lambda$. As described above, the incident laser beams 34 and 35 are projected onto the alignment marks 12 on the wafer 2 through the image forming lens 13 and the objective lens 11. Here, it is further assumed that the pitch of the alignment marks 12 is denoted by P and that an optical sub-system comprised of elements from the incident objective lens 23 to the image surface of the incident image forming lens 25 is made to be equivalent to another optical sub-system comprised of elements from the image surface to the objective lens 11 through the image forming lens 13, the angles of incidence of the laser beams 28 and 29 projected from the objective lens 11 onto the alignment marks 12 of the wafer 2 is set in such a manner to meet the following equation:

$$\theta = \arcsin(\lambda/P) \quad (3)$$

Thus, among diffracted beams produced at the alignment marks 12, a diffracted beam 30, which is reflected in the direction of the optical axis of the objective lens 11, is further reflected by the mirror 27 through the mirror 10, the beam splitter 9, the image forming lens 13, the beam splitter 14, the mirror 26 and the incident image forming lens 25. Further, the diffracted beam 30 is incident on the photodetector 32 through the polarizer 31. At that time, the quantity of a position deviation quantity between the diffraction gratings 12 and the alignment marks 12 can be detected as a phase difference by regulating the direction of rotation of the polarizer 31 and using a position detecting portion (not shown). Namely, the phase difference $\phi$ can be obtained by the following equation indicating the relation among the position deviation quantity x, the pitch P and the phase difference $\phi$.

$$\phi = 360° \cdot 2x/P \quad (4)$$

Thus, a high-precision position measurement can be realized by effecting this laser measurement. Namely, a high-accuracy alignment of the wafer 2 can be performed.

Thus, in case of this embodiment, a compact alignment system can be realized by employing an optical sub-system common to the image processing sub-system for a coarse position measurement and the laser alignment sub-system for a fine position measurement. Moreover, an influence of relative change caused with the lapse of time is prevented. Furthermore, as described above, the alignment marks 12 are made up of equipitch diffraction gratings. Thus, the intensity of the diffracted light which is reflected by the alignment marks is averaged. Thereby, a measurement accuracy can be improved. Furthermore, the position deviation quantity can be detected as a phase of a signal by using laser beams having two frequencies and polarized surfaces intersecting perpendicularly to each other. Thereby, a high-accuracy measurement of the position deviation quantity can be achieved without any reciprocation of the wafer stage.

Incidentally, the quarter-plates 37 and 40 and an appropriate polarizer may be inserted in a pre-stage of the photodetector 32 instead of being provided between the polarization beam splitter 33 and the incident image forming lens 23. Further, the Zeeman laser is employed as the laser beam source 17 in this embodiment. An ordinary laser, however, may be employed in place of the Zeeman laser. In such a case, the half-wave plate 22 becomes unnecessary. Further, it follows that the position measurement is effected by detecting the intensity of light instead of the phase of a signal and thus a maximum intensity of light is detected by reciprocatively driving the wafer stage and repeatedly emitting laser beams similarly as in the case of the conventional system.

Figure 5:
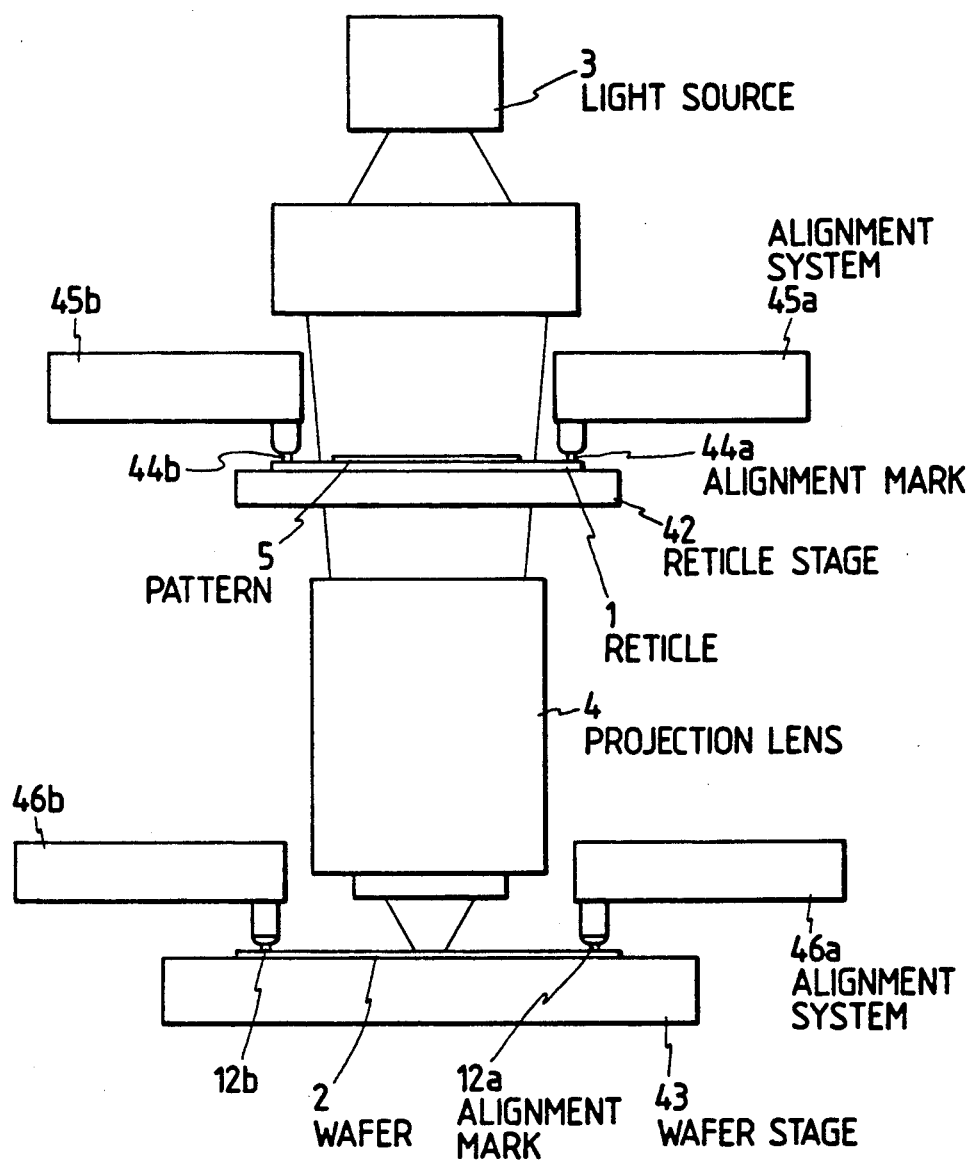
FIG. 5 is a side elevational view of a third alignment system embodying the present invention.
Figure 6:
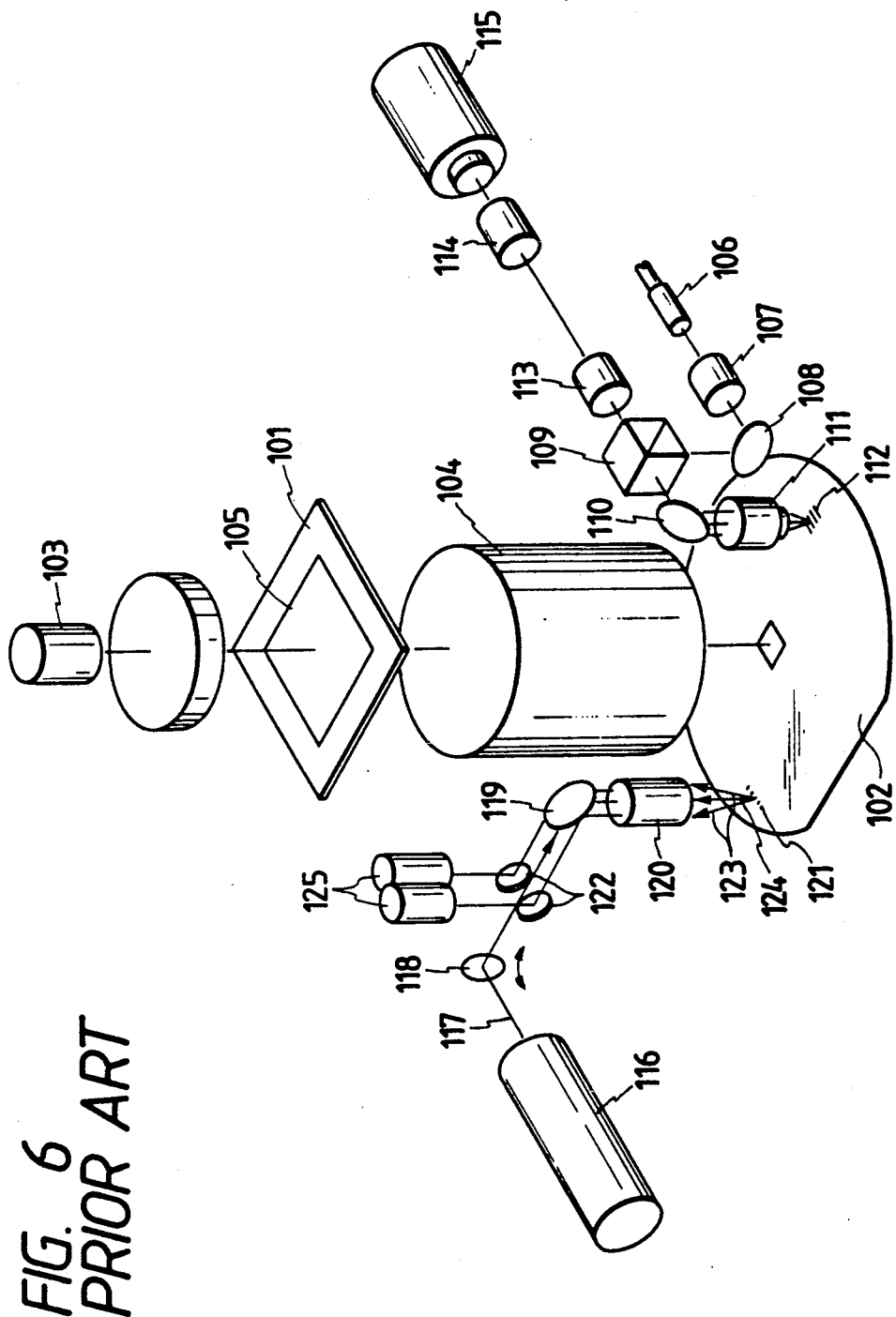
FIG. 6 is a perspective diagram for illustrating the entire construction of a conventional alignment system.

Next, a third embodiment of the present invention will be described hereinbelow. FIG. 5 is a schematic diagram for illustrating the construction of the third embodiment, namely, a third alignment system embodying the present invention.

In FIG. 5, reference numeral 1 designates a reticle; 2 a wafer; 3 a light source for an exposure; 4 a projection lens for shrinking and replicating a pattern for an exposure pattern of the reticle 1 on the wafer 2; 5 the pattern for an exposure of the reticle 1; 42 a reticle stage for supporting the reticle 1; 43 a wafer stage for supporting the wafer 2; 44a and 44b alignment marks made up of diffraction gratings provided on the reticle 1; 12a and 12b alignment marks made up of diffraction gratings provided on the wafer 2; 45a and 45b alignment systems for performing an alignment of the reticle 1; and 46a and 46b alignment systems for performing an alignment of the reticle 1. These alignment systems 45a, 45b, 46a and 46b are constructed in a manner similar to the manner in which the first or second embodiment is constructed.

Hereinafter, the construction of the third embodiment, as well as an operation of the second embodiment constructed as above described, will be more detailedly described.

First, the reticle 1 is transferred by a reticle transfer system (not shown) to an alignment position on the reticle stage 42. Simultaneously, the wafer 2 is transferred by a wafer transfer system (not shown) to an alignment position on the wafer stage 43. Further, the demagnification and replication of an exposing pattern 5 of the reticle 1 illuminated with light from a light source 3 onto the wafer 2 is effected. At that time, for the purpose of performing the alignments of the reticle 1 and the wafer 2, the alignment marks 44a and 44b on the reticle 1 are detected by effecting an image processing by using the video camera 16 of each of the alignment systems 45a and 45b. Then, the positions of the alignment marks 44a amd 44b are calculated and a deviation between the calculated position of each of the alignment marks 44a and 44b and the position at which the reticle 1 should be aligned. Subsequently, a coarse alignment of the reticle 1 is performed by driving the reticle stage 42. Next, the positions of the alignment marks 44a and 44b are measured by performing position detections by using laser beams 18 which are emitted by Zeeman lasers 17 of the alignment systems 45a and 45b. Based on the results of the measurement, a fine alignment of the reticle 1 is effected by driving the reticle stage 42. Subsequently, the alignment marks 12a and 12b on the wafer 2 are detected by effecting an image processing by using the video camera 16 of each of the alignment systems 46a and 46b. Then, the positions of the alignment marks 12a and 12b are calculated and a deviation between the calculated position of each of the alignment marks 12a and 12b and the position at which the wafer 2 should be aligned. Subsequently, a coarse alignment of the wafer 2 is performed by driving the wafer stage 43. Next, the positions of the alignment marks 12a and 12b are measured by performing position detections by using laser beams 18 which are emitted by Zeeman lasers 17 of the alignment systems 46a and 46b. Based on the results of the measurement, a fine alignment of the wafer 2 is effected by driving the wafer stage 43.

Incidentally, in the third embodiment, two alignment systems are employed for the alignment of each of the reticle and the wafer. The number of the alignment systems employed for the alignment of each of the reticle and the wafer may be increased in accordance with necessary alignment accuracy.

Thus, similarly as in case of the first and second embodiments, an influence of relative change caused with the lapse of time is prevented, so that high-accuracy alignments of the reticle 1 and the wafer 2 can be achieved. Additionally, a compact alignment system can be realized. Furthermore, a high-accuracy measurement of the position measurement can be achieved without any reciprocation of the wafer stage.

While preferred embodiments of the present invention have been described above, it is to be understood that the present invention is not limited thereto and that other modifications will be apparent to those skilled in the art without departing from the spirit of the invention. The scope of the present invention, therefore, is to be determined solely by the appended claims.

What is claimed is:

1. A system for alignment of a substrate, comprising:
   (a) a common optical system portion for receiving light input thereto, for projecting the received light onto an alignment mark made up of a diffraction grating formed on the substrate, and for outputting light diffracted by the alignment mark;
   (b) a first optical system portion for fine substrate alignment having:
      a laser source for emitting a laser beam;
      a first optical sub-system for receiving the laser beam from the laser source and outputting the received laser beam to the common optical system portion as a first input light thereto;
      a second optical sub-system for receiving a laser beam diffracted by the alignment mark and outputted from the common optical system portion as a first output light thereof; and
      a photoelectric detection portion for performing a photoelectric conversion of the laser beam outputted from the second optical sub-system;
   (c) a position detecting portion for measuring the position of the substrate based on a signal outputted from the photoelectric detection portion; and
   (d) a second optical system portion for coarse substrate alignment having:
      a light source for emitting an illumination light to illuminate the alignment mark;
      a third optical sub-system for transmitting the illumination light to the common optical system portion as a second input light thereto;
      a fourth optical sub-system for receiving the illumination light from the alignment mark outputted from the common optical system portion as a second output light thereof to form an image of the alignment mark; and
      a fifth optical sub-system having a camera for observing the image of the alignment mark; and
   (e) an image processing portion for performing image processing of video signals outputted from the camera.

2. The alignment system as set forth in claim 1, wherein the laser beam emitted from the laser source has two wavelengths whose corresponding frequencies slightly differ from each other and whose corresponding planes of polarization intersect perpendicularly to each other;
   wherein the first optical sub-system comprises:
   unpolarized beam splitting means for receiving the laser beam, which have two wavelengths, from the laser source and splitting the received laser beam into at least two laser beams; and
   a half-wave plate for receiving at least one of the split laser beams from the beam splitting means and changing the direction of vibration thereof; and
   wherein the second optical sub-system comprises:
   a condenser lens for condensing the laser beam diffracted by the alignment mark and outputted from the common optical system portion; and
   a polarizer for receiving the laser beams from the condenser lens and selection one of the two planes of polarization of the laser beam.

3. The alignment system as set forth in claim 1, wherein the laser beam emitted from the laser source has two wavelengths whose corresponding frequencies slightly differ from each other and whose corresponding planes of polarization intersect perpendicularly to each other; and
   wherein the first optical sub-system comprises:
   a polarization beam splitter for splitting the laser beam into at least two laser beams; and
   polarizing means for converting each of the laser beams from the splitter from a linearly polarized state to a circularly polarized state; and
   wherein the second optical sub-system comprises:
   a condenser lens for condensing the laser beam diffracted by the alignment mark and outputted from the common optical system portion.

4. The alignment system as set forth in claim 1, wherein the laser beam emitted from the laser source has two wavelengths whose corresponding frequencies slightly differ from each other and whose planes of polarization intersect perpendicularly to each other;
   wherein the first optical sub-system comprises:
   a polarization beam splitter for splitting the laser beam into at least two laser beams; and
   wherein the second optical sub-system comprises:
   a condenser lens for condensing the laser beam diffracted by the alignment mark and outputted from the common optical system portion; and
   polarizing means for converting each of the laser beams from the splitter from a linearly polarized state to a circularly polarized state.

5. The alignment system as set forth in claim 1, wherein the position detecting portion has a phase meter for detecting phase difference between a reference signal outputted from the laser source and a measuring signal outputted from the photoelectric detection portion.

6. The alignment system as set forth in claim 1, wherein the common optical system portion is in an optical conjugate relation to the second optical sub-system with respect to the alignment marks on the substrate.

7. A system for alignments of a reticle and a wafer, a pattern on the reticle projected on the wafer, comprising:
   (a) a first common optical system portion for receiving input light thereto, for projecting the received light onto a first alignment mark made up of a diffraction grating formed on the reticle, and for outputting light diffracted by the first alignment mark;
   (b) a first optical system portion for fine reticle alignment having:
      a first laser source for emitting a first laser beam;
      a first optical sub-system for receiving the first laser beam from the first laser source and outputting the received first laser beam to the first common optical system portion as a first input light thereto; and
      a second optical sub-system for receiving the first laser beam diffracted by the first alignment mark and outputted from the first common optical system portion as a first output light thereof; and a first photoelectric detection portion for performing a photoelectric conversion of the first laser beam outputted from the second optical sub-system;

(c) a first position detecting portion for measuring the position of the reticle based on a signal outputted from the first photoelectric detection portion;

(d) a second optical system portion for coarse reticle alignment having:

a first light source for emitting a first illumination light to illuminate the first alignment mark;

a third optical sub-system for transmitting the first illumination light to the first common optical system portion as a second input light thereto;

a fourth optical sub-system for receiving the first illumination light from the first alignment mark and outputted from the first common optical system portion as a second output light thereof, to form an image of the first alignment mark;

a fifth optical sub-system having a first camera for observing the image of the first alignment mark;

(e) an image processing portion for performing image processing of video signals outputted from the first camera;

(f) a second common optical system portion for receiving light input thereto, for projecting the received light onto a second alignment mark made up of a diffraction grating formed on a wafer, and for outputting light diffracted by the second alignment mark;

(g) a third optical system portion for fine wafer alignment having:

a second laser source for emitting a second laser beam;

a sixth optical sub-system for receiving the second laser beam from the second laser source and outputting the received second laser beam to the second common optical system portion as a second input light thereto;

a seventh optical sub-system for receiving the second laser beam diffracted by the second alignment mark and outputted from the second common optical system portion as a second output light thereof; and a second photoelectric detection portion for performing a photoelectric conversion of the second laser beam outputted from the seventh optical sub-system;

(h) a second position detecting portion for measuring the position of the wafer based on a signal outputted from the second photoelectric detection portion;

(i) a fourth optical system portion for coarse wafer alignment having:

a second light source for emitting a second illumination light to illuminate the second alignment mark;

an eighth optical sub-system for transmitting the second illumination light to the second common optical system portion as a second input light thereto;

a ninth optical sub-system for receiving the second illumination light from the second alignment mark and outputted from the second common optical system portion as a second output light thereof, to form an image of the second alignment mark; and a tenth optical sub-system having a second camera for observing the image of the second alignment mark; and wherein the image processing portion performs image processing of video signals outputted from the second camera.

8. The system as set forth in claim 7, wherein the first common optical system portion is in an optical conjugate relation to the second optical sub-system with respect to the first alignment marks on the reticle, wherein the second common optical system portion is in an optical conjugate relation to the fourth optical sub-system with respect to the first alignment marks on the reticle.

* * * * *